(12) United States Patent
Derderian (10) Patent No.: US 7,675,131 B2
(45) Date of Patent: Mar. 9, 2010

(54) FLIP-CHIP IMAGE SENSOR PACKAGES AND METHODS OF FABRICATING THE SAME

(75) Inventor: James M. Derderian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 32 days.

(21) Appl. No.: 11/784,145

(22) Filed: Apr. 5, 2007

(65) Prior Publication Data

US 2008/0246133 A1   Oct. 9, 2008

(51) Int. Cl.
*H01L 31/0232* (2006.01)
*H01L 29/24* (2006.01)

(52) U.S. Cl. .................. 257/432; 257/434; 257/100; 257/784; 257/787; 257/778; 257/E25.032

(58) Field of Classification Search .............. 257/678, 257/E23.01, 432, 434, 100, 784, 787, 778, 257/E25.032, E31.093
See application file for complete search history.

(56) References Cited

U.S. PATENT DOCUMENTS

| | | | |
|---|---|---|---|
| 6,342,406 B1 | 1/2002 | Glenn | |
| 6,384,473 B1 | 5/2002 | Peterson | |
| 6,621,152 B2* | 9/2003 | Choi et al. | 257/678 |
| 6,624,868 B1 | 9/2003 | Terukina | |
| 6,833,612 B2 | 12/2004 | Kinsman | |
| 6,849,916 B1 | 2/2005 | Glenn | |
| 6,873,024 B1* | 3/2005 | Prabhu et al. | 257/434 |
| 6,885,107 B2 | 4/2005 | Kinsman | |
| 6,917,090 B2* | 7/2005 | Moden | 257/431 |
| 6,940,141 B2 | 9/2005 | Kinsman | |
| 6,956,295 B2 | 10/2005 | Kinsman | |

(Continued)

FOREIGN PATENT DOCUMENTS

JP          2010395          1/1990

(Continued)

OTHER PUBLICATIONS

S. Pinal, et al., Future ICs Go Vertical-Semiconductor International, "Ultra Thin Chip Vertical Interconnect Technique," Proc. . . . Vertical Interconnection for High Density 3-D Chip Stacking Package, Proc. . . . 1. www.reed-electronics.com/semiconductor/article/CA499680.

(Continued)

*Primary Examiner*—Nitin Parekh
(74) *Attorney, Agent, or Firm*—Fletcher Yoder (57) ABSTRACT

There is provided an imager package including an image sensor die attached to a transparent substrate such that sensitive image sensing components on the sensor die face the transparent substrate. In accordance with an embodiment of the present technique, the imager package may be coupled to an external package via bond wires and other interconnect elements. The sensor die and bond wires may be protected by an encapsulant on which the interconnect elements may be disposed. The bond wires may enable placement of the interconnect elements partially or directly above the sensor die, as opposed to around an outer periphery of the sensor die. There is further provided a method of manufacturing an imager package wherein interconnect elements may be located partially or directly above the sensor die, enabling the manufacture of smaller imager packages than previously envisioned.

27 Claims, 5 Drawing Sheets

U.S. PATENT DOCUMENTS

| | | |
|---|---|---|
| 6,964,886 B2 | 11/2005 | Kinsman |
| 6,982,470 B2 * | 1/2006 | Omori .................. 257/434 |
| 7,049,689 B2 | 5/2006 | Yeh |
| 7,122,390 B2 | 10/2006 | Kinsman |
| 7,563,652 B2 * | 7/2009 | Yang et al. ............. 438/126 |
| 2004/0036154 A1 * | 2/2004 | Ho et al. ................. 257/678 |
| 2004/0056340 A1 * | 3/2004 | Jobetto .................. 257/678 |
| 2004/0085281 A1 | 5/2004 | Chung |
| 2004/0188699 A1 * | 9/2004 | Kameyama et al. ...... 257/99 |
| 2005/0001331 A1 * | 1/2005 | Kojima et al. ........... 257/778 |
| 2005/0041191 A1 | 2/2005 | Lim |
| 2005/0230844 A1 | 10/2005 | Kinsman |
| 2006/0049423 A1 * | 3/2006 | Yamaguchi et al. ....... 257/100 |
| 2006/0154405 A1 | 7/2006 | Kinsman |
| 2007/0108579 A1 * | 5/2007 | Bolken et al. ............. 257/680 |

FOREIGN PATENT DOCUMENTS

| | | |
|---|---|---|
| JP | 3149523 | 6/1991 |

OTHER PUBLICATIONS

Paul Franzon et al., High Frequency, High Density Interconnect Using AC Coupling, AC Coupled Interconnection (ACCI). www.mrs.org/s_mrs/sec_subscribe.asp?CID=2617&DID=115816&action=detail.

* cited by examiner

FLIP-CHIP IMAGE SENSOR PACKAGES AND METHODS OF FABRICATING THE SAME

BACKGROUND

1. Field of the Invention

Embodiments of the present invention relate generally to the field of semiconductor devices and more particularly to flip-chip imager packages.

2. Description of the Related Art

Image sensors, such as, for example, charge coupled device (CCD) image sensors or complementary metal-oxide semiconductor (CMOS) image sensors, are electronic devices used for capturing digital images by converting perceived color and brightness to electrical signals. For example, an image sensor may be a microchip with millions of small lenses each focusing light on an individual pixel of the microchip. Light that passes through the lenses and impinges on the pixels is converted to an electrical signal based on its intensity. These electrical signals are then conveyed to a circuit assembly which is coupled to the sensor. This assembly may organize and name a group of signals for storage and later conversion to an image, such as, for example, a photograph or a movie.

Figure 1:
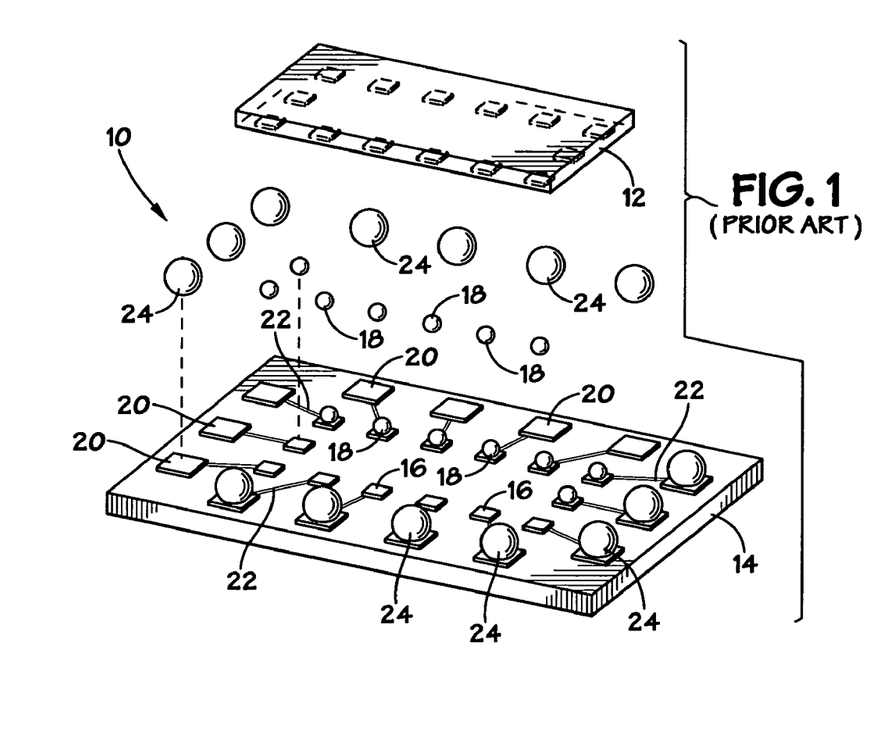
FIG. 1 is an exploded view of a flip-chip imager package according to the prior art.

Because the lenses used in image sensors are susceptible to contamination, image sensors may be packaged within a housing to provide protection for the lenses and electrical connections. An exploded view of a conventional imager package 10 is illustrated in FIG. 1. In this example, formation of the imager package 10 has been accomplished by attaching a sensor die 12 to a transparent substrate 14 using flip-chip technology. A sealant (not shown) secures the sensor die 12 to the transparent substrate 14. The sensor die 12 is coupled to inner attachment pads 16 on the transparent substrate 14 via small solder balls 18. The inner attachment pads 16 are coupled to outer attachment pads 20 via conductive traces 22. Large solder balls 24 are then coupled to the outer attachment pads 20. The solder balls 24 are designed such that they may be coupled to an external package (not shown), and therefore the solder balls 24 generally have a diameter larger than the thickness of the sensor die 12 so that any device attached thereto does not directly contact the sensor die 12. Signals from the sensor die 12 may then be routed from pads on the underside of the sensor die 12 to the external package via the small solder balls 18, the inner attachment pads 16, the conductive traces 22, the outer attachment pads 20, and the solder balls 24.

According to the technique illustrated in FIG. 1, to avoid placing an external package in contact with the top surface of the sensor die 12 the solder balls 24 are typically large compared to the sensor die 12. In addition, all connections to external packages are typically situated around the periphery of the sensor die 12. This design places constraints on the size of the imager package 10 because it must be large enough to accommodate the sensor die 12 and the plurality of solder balls 24 situated around the sensor die 12.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

In accordance with present embodiments, an imager package is provided such that sensitive image sensing components are protected by complete encapsulation of an image sensor on a transparent substrate. The image sensing components may be activated through the transparent substrate. Electrically conductive paths connect the image sensor to an external package. Bond wires are used to form the electrically conductive paths from conductive traces on the transparent substrate through the encapsulant to an external surface of the imager package. The electrically conductive paths may include other conductive elements in the encapsulant and/or interconnect elements on a backside of the encapsulant.

Figure 2:
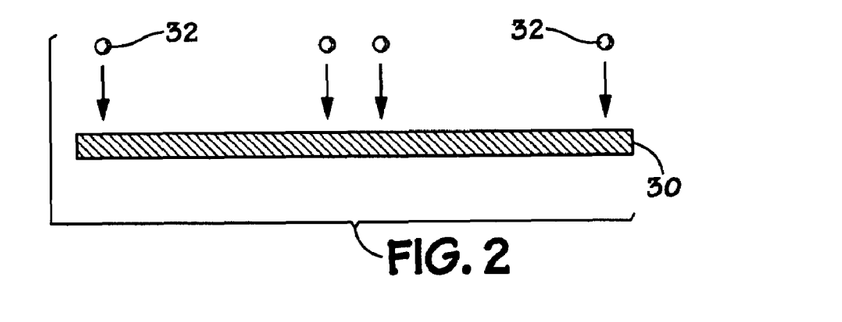
FIGS. 2-9 are diagrammatical views of steps of a process for creating an imager package in accordance with an embodiment of the present invention.

Referring initially to FIGS. 2-9, steps of a process for producing an imager package in accordance with an embodiment of the present invention are illustrated. Initially, an image sensor wafer 30 is provided and conductive elements 32 are attached to pads (not shown) on an active side of the image sensor wafer 30, as illustrated in FIG. 2. The sensor wafer 30 may include a number of imaging sensors fabricated therefrom. The conductive elements 32 may include any structures suitable for flip-chip attachment, such as, for example, solder balls or stud bumps made of a conductive material, such as gold or copper. The size of the conductive elements may vary depending on the design of the imager package, as described further below.

Figure 3:
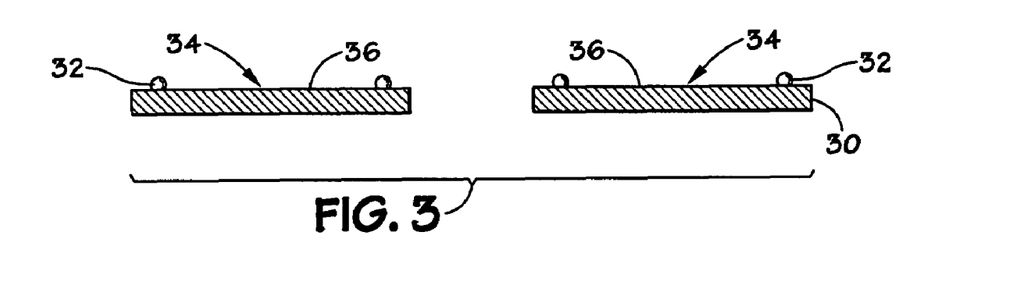

After attachment of the conductive elements 32, the image sensor wafer 30 is singulated into a number of individual sensor dies 34 via a saw process or laser process, for example. Each sensor die 34 has an active surface 36 containing sensitive active components. For example, active components of the sensor die 34 may include lenses which should be protected from dust and abrasion to work properly.

Figure 4:
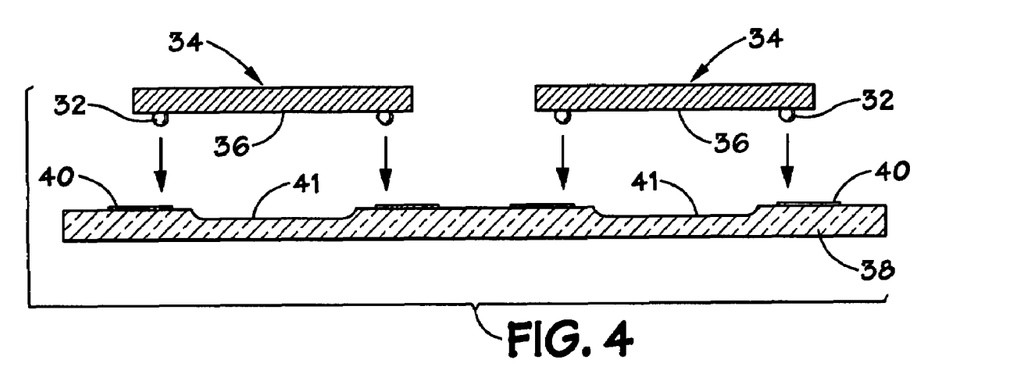

The sensor die 34 is then flipped and attached to a transparent substrate 38, as illustrated in FIG. 4. That is, each sensor die 34 is attached to the transparent substrate 38 such that the active surface 36 of the sensor die 34 faces the transparent substrate 38. In the context of this technique, a "transparent" material refers to a material that transmits visible light sufficiently for the operation of the sensor dies 34. The transparent substrate 38 may include, for example, glass, plastic, or any other suitably transmissive substance. A top surface of the transparent substrate 38 has conductive redistribution and/or bussing traces which lead to bond pads 40. The conductive elements 32 of the sensor die 34 are coupled to the bond pads 40. In addition, the transparent substrate 38 may have cavities 41 which provide an air pocket between the transparent substrate 38 and the active surface 36 of the sensor die 34. Alternatively, the conductive elements 32 may be sufficiently large that there is a gap between the active surface 36 and the transparent substrate 38. These configurations provide for protection of the sensitive active components on the active surface 36 of the sensor die 34.

Figure 5:
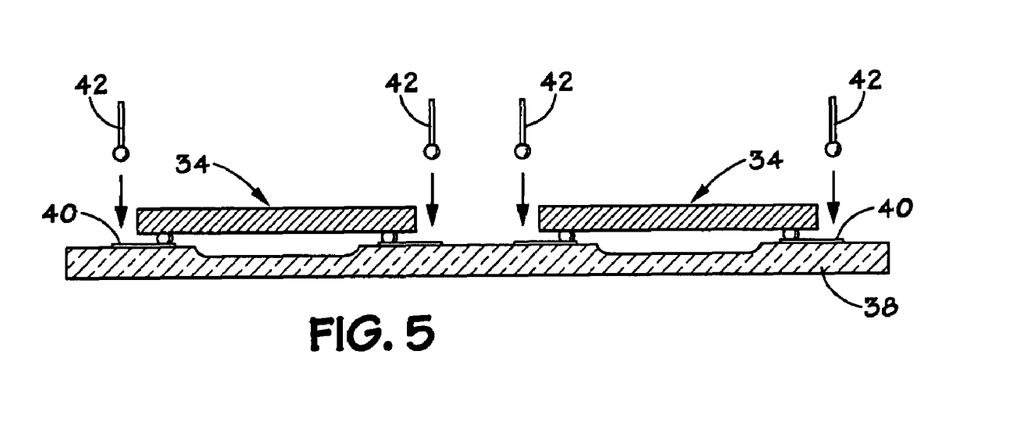

Next, bond wires 42 are attached to the bond pads 40 and may terminate in mid-air, as illustrated in FIG. 5. The bond wires 42 may be composed of electrically conductive material, such as, for example, gold or copper. As described further below, the bond wires 42 will provide an electrically conductive path from the bond pads 40 (and thus the sensor dies 34) to a point external to the imager package.

Figure 6:
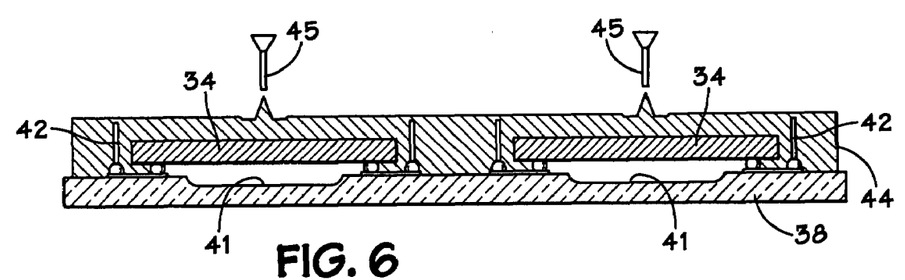

Referring to FIG. 6, an encapsulant 44 is applied to enclose and protect the sensor die 34 and the bond wires 42. In one embodiment, the encapsulant 44 may also serve to secure the sensor die 34 to the transparent substrate 38, obviating the need for a sealant between the two structures. As will be appreciated by, the encapsulant 44 may comprise a molding compound, such as a resin, and may be disposed via an injection molding process, for example, by employing an injection dispenser 45. The encapsulant 44 may flow by capillary action into the narrow gap between the substrate 38 and the die 34 around the perimeter of the cavity 41, effectively sealing a pocket of air over the active components. In another embodiment, a sealant may be applied prior to applying the encapsulant 44 to prevent the encapsulant 44 from flowing into the cavity 41. The sealant may have viscous or thixotropic properties such that allow it to seal the perimeter of the die 34 to the transparent substrate 38 without encroaching on the active components and may be cured with UV light.

Figure 7:
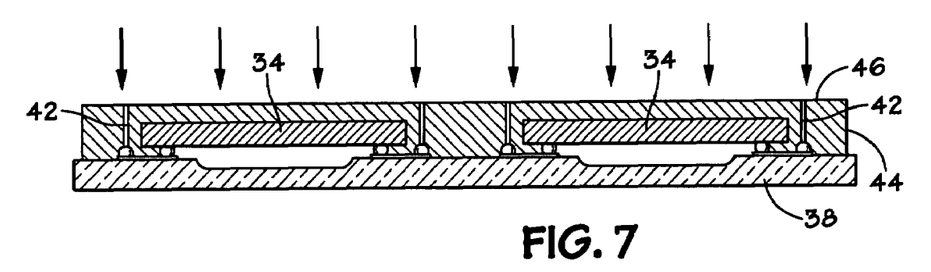

After the encapsulant 44 is cured or hardened, a backside 46 of the encapsulant 44 may be ground or planarized such that the bond wires 42 are exposed, as illustrated in FIG. 7. In the context of this technique, a "backside of the encapsulant" refers to a surface adjacent an inactive side of the sensor die 34.

Figure 8:
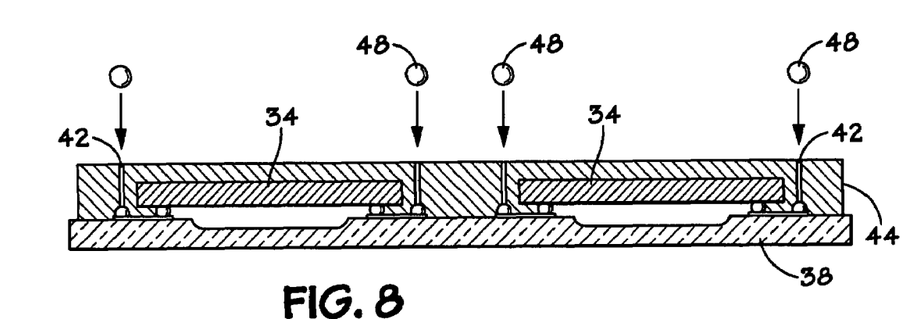
Figure 9:
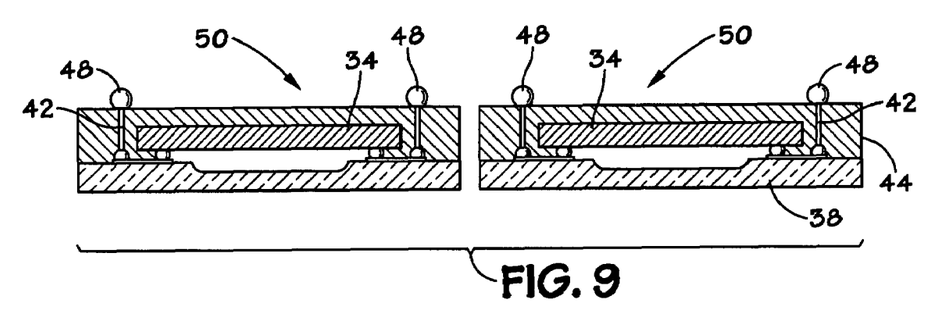

Referring to FIG. 8, conductive balls 48 are coupled to the exposed bond wires 42. In one embodiment, the conductive balls 48 may be solder balls. In contrast to the large solder balls 24 illustrated in FIG. 1, the conductive balls 48 may have a small diameter compared to the thickness of the sensor die 34. That is, the diameter of the conductive balls 48 is advantageously less than the thickness of the encapsulated sensor die 34. The transparent substrate wafer may then be singulated, as illustrated in FIG. 9, producing final imager packages 50.

Figure 10:
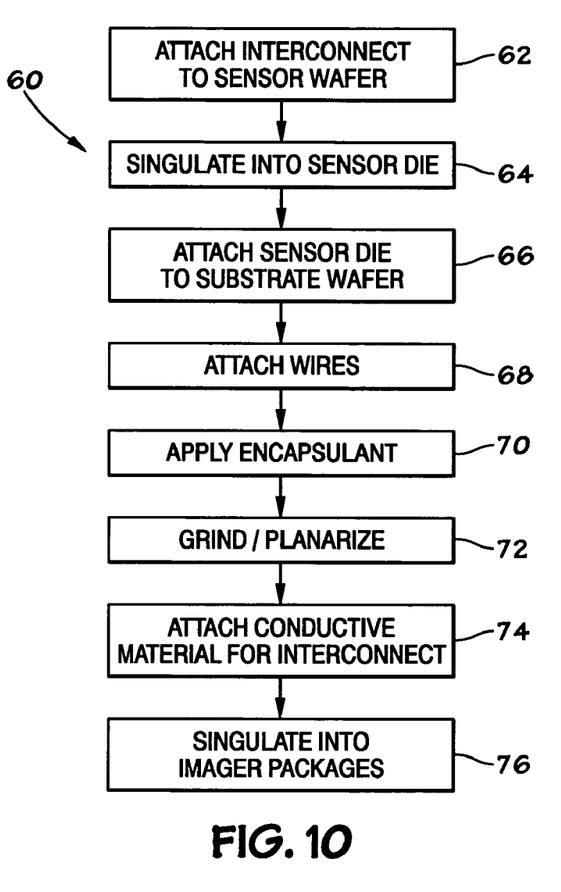
FIG. 10 is a flow chart of the process illustrated in FIGS. 2-9.

FIG. 10 is a flow chart of a process 60 summarizing the steps illustrated in FIGS. 2-9. In the process 60, conductive elements are attached to bond pads on a sensor wafer (Block 62). The sensor wafer contains a number of sensors having image sensing components. The conductive elements are attached to an active face of the sensor wafer such that an electrically conductive path is formed from the image sensing components, through conductive traces, to the bond pads, and finally to the conductive elements. The sensor wafer is then singulated into individual sensor dies (Block 64).

The sensor dies are attached to a transparent substrate wafer such that the conductive elements on the sensor dies are coupled to bond pads on the transparent substrate (Block 66). The active face of the sensor wafer therefore faces the transparent substrate, and the electrically conductive path extends to the transparent substrate. Bond wires are then attached to the bond pads on the transparent substrate (Block 68). The bond wires are composed of an electrically conductive material, thereby continuing the electrically conductive path from the image sensing components.

An encapsulant is then applied to the transparent substrate wafer (Block 70). The encapsulant serves to both protect the sensor die and the components of the electrically conductive path and to secure the sensor die to the transparent substrate. Because the encapsulant and the transparent substrate completely surround and cover the sensor die, the sensitive image sensing components are protected from damage due to dust and debris. The backside of the encapsulant is then ground or planarized such that the bond wires are accessible (Block 72). Interconnect elements, such as conductive solder balls, are coupled to the exposed bond wires (Block 74), completing the electrically conductive path from the image sensing components. The wafer is singulated into individual imager packages (Block 76). Each imager package includes electrically conductive paths from the image sensor components on the sensor die to external interconnect elements on the backside of the package (e.g., conductive balls 48). The external interconnect elements may be coupled to external interconnect elements on an external package, thereby completing an electrically conductive path from the image sensor components to an external package or system. The external package may include, for example, printed circuit boards or printed wiring boards, controllers, memory, image processors, or other electronic components used in image sensing devices such as cell phones, digital cameras, computer cameras, portable digital assistants, or vision systems.

Figure 11:
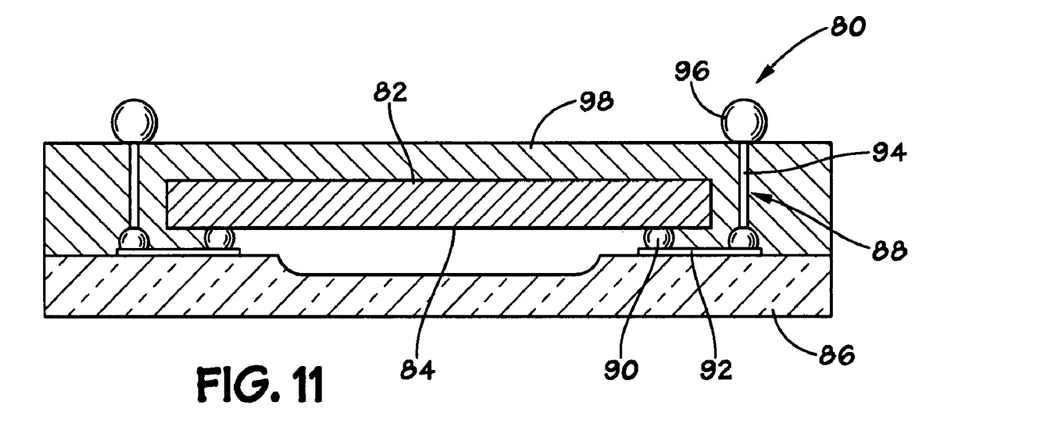
FIG. 11 is a diagrammatical view of an imager package created in accordance with the process illustrated in FIGS. 2-10.

An imager package 80 produced according to the process 60 of FIG. 10 is illustrated in FIG. 11. Accordingly, imager package 80 is the same as each imager package 50 of FIG. 9. The imager package 80 is illustrated to provide a more detailed view of certain features of the imager package 50. The imager package 80 includes a sensor die 82 with an active surface 84 facing a transparent substrate 86. An electrically conductive path 88 includes a conductive element 90, a bond pad 92, a wire 94, and an interconnect element 96. The electrically conductive path 88 is configured to transfer electronic signals from the active surface 84 of the sensor die 82 to an external package (not shown). An encapsulant 98 protects the sensor die 82 and the components of the electrically conductive path 88 which are not designed to be coupled to an external package.

Alternative embodiments of the imager package are illustrated in FIGS. 12-16. These alternative imager packages may be produced in a manner substantially similar to that of the process 60 as described in FIG. 10. Those skilled in the art will appreciate necessary variations in the process 60 to produce any of the packages of FIGS. 12-16. Further, those features not explicitly described with reference to FIGS. 12-16 can be considered similar to those like features previously described.

Figure 12:
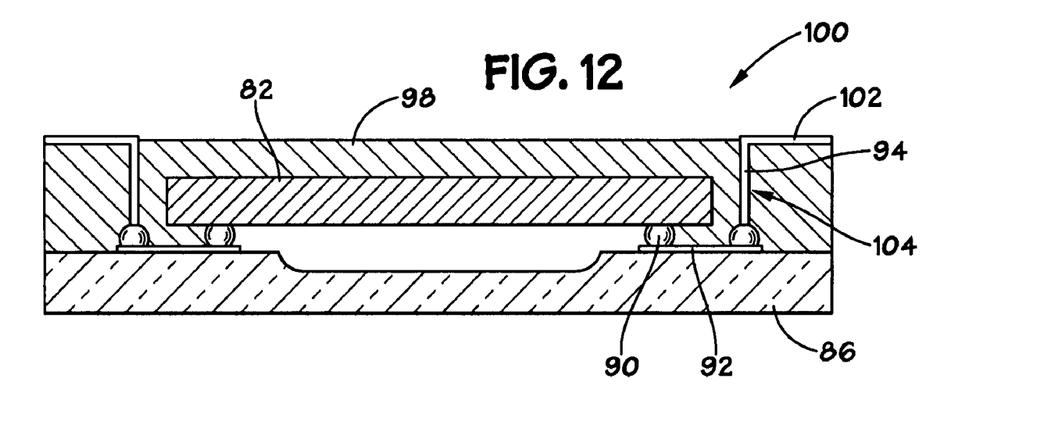
FIGS. 12-16 are imager packages in accordance with alternative embodiments of the present invention.

Referring now to FIG. 12, an imager package 100 may include land pads 102 configured to couple the imager package 100 to an external package. The land pads 102 may be any shape and may be made of a conductive material, such as, for example, gold or copper. Creation of the land pads 82 may include techniques known in the art such as, for example, sputtering a conductive layer onto the backside of the encapsulant, masking the conductive layer according to a desired pattern, and etching the masked layer. An electrically conductive path 104 may include the conductive element 90, the bond pad 92, the bond wire 94, and the land pad 102.

Figure 13:
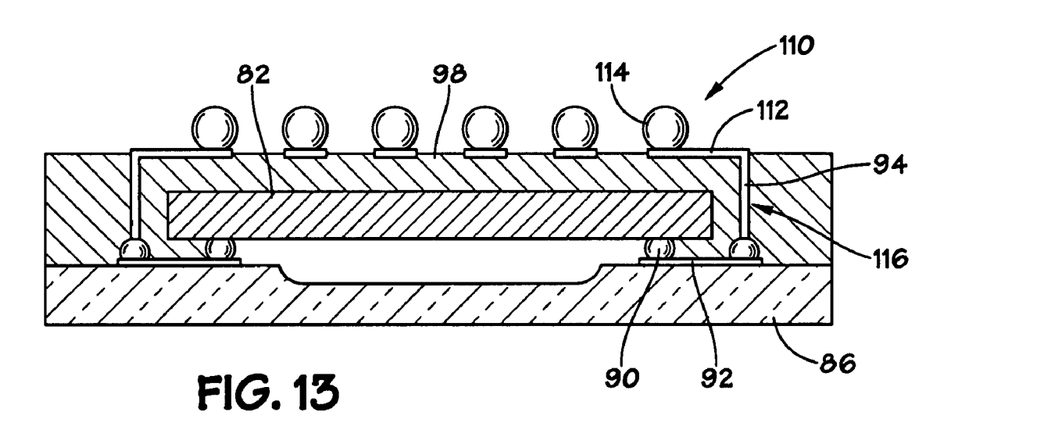

Another embodiment of an imager package 110 is illustrated in FIG. 13. In this embodiment, a redistribution and/or bussing grid 112 may be applied to the backside of the encapsulant 98. Creation of the grid 112 may be similar to that of the land pads 102 described in reference to FIG. 12. Conductive elements 114, such as solder balls, may then be coupled to the redistribution and/or bussing grid 112, creating a ball grid which may be coupled to an external package. An electrically conductive path 116 may include the conductive element 90, the bond pad 92, the bond wire 94, the grid 112, and the conductive elements 114. An advantage of this and similar embodiments of the imager package is that the conductive elements 114 are located above the sensor die 82 rather than around it, allowing for more compact packaging.

Figure 14:
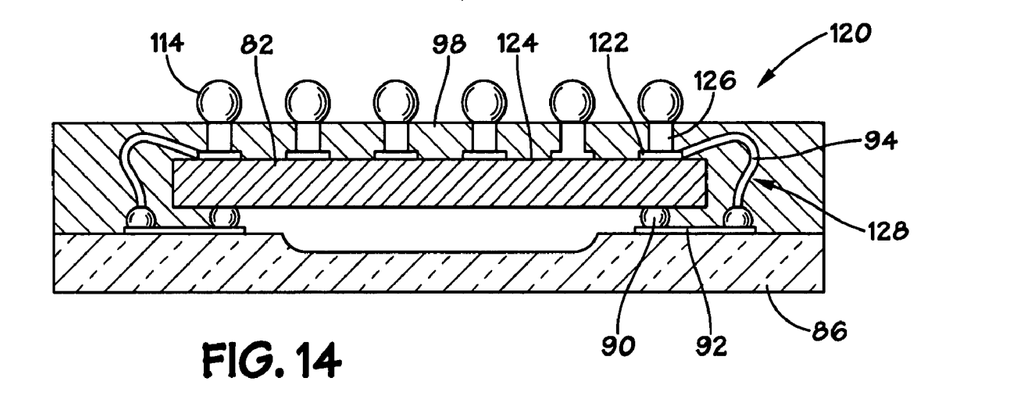
Figure 15:
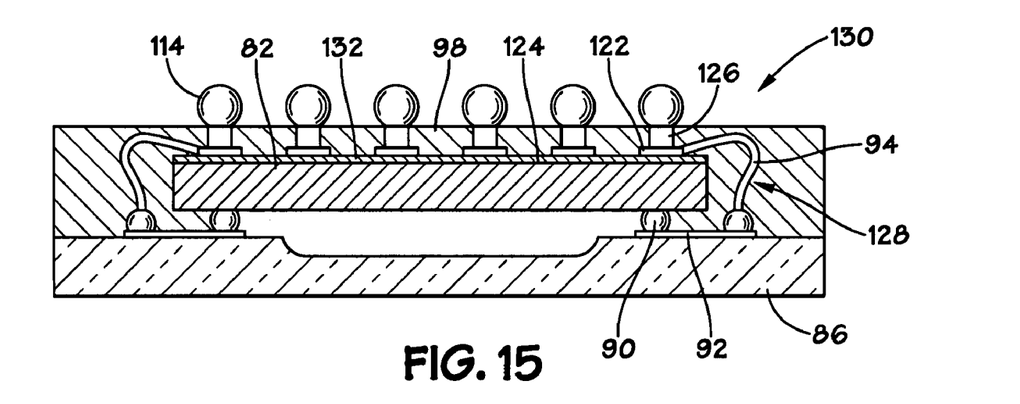

Alternative techniques for creating an imager package with a ball grid are illustrated in FIGS. 14 and 15. An imager package 120, illustrated in FIG. 14, is created by forming a redistribution and/or bussing grid 122 on an inactive side 124 of the sensor die 82. The bond wires 94 and conductive studs 126 are then connected to the grid 122. Conductive studs may include, for example, plated bumps or stud bumps, and may be composed of material such as gold or copper. In this embodiment, the conductive studs 126 are part of the electrically conductive path 128 from the imaging sensors to an external package. Accordingly, the electrically conductive path 128 may include the conductive element 90, the bond pad 92, the bond wire 94, the grid 122, the conductive stud 126, and the conductive elements 114.

Alternatively, an imager package 130, illustrated in FIG. 7, may include an insulating substrate 132 on the inactive side 124 of the sensor die 82. The insulating substrate 132 may include, for example, a non-conductive laminate or ceramic to insulate the sensor die 82 from the conductive studs 126. The insulating substrate 132 and/or the conductive studs 126 may be applied to the sensor wafer before it is singulated into the sensor die 82 or after the sensor die 82 is attached to the transparent substrate 86. Approaches known to those skilled in the art may be used to apply the substrate 132 and/or the conductive studs 126 to the sensor die 82.

Figure 16:
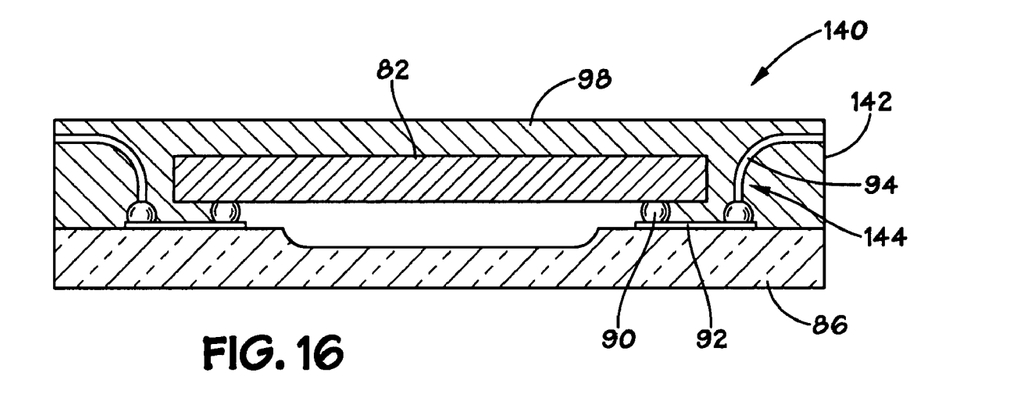

FIG. 16 illustrates a side castellated imager package 140 according to an embodiment of the present technique. The bond wires 94 may be attached to the bond pads 92 at one end and dummy pads (not shown) at the other end. During singulation of the imager packages 140, the dummy pads may be diced off so that the bond wires 94 terminate on sides 142. This configuration may be advantageous where, for example, side connections are preferred for hand soldering the imager package 140 to an external package. The sides 142 of the imager package 140 may be ground and/or planarized after singulation. In the side castellated imager package 140, an electrically conductive patch 144 may include the conductive element 90, the bond pad 92, and the bond wire 94.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An electronic device comprising:
    a transparent substrate having bond pads;
    a sensor die coupled to the bond pads on the transparent substrate, wherein an active side of the sensor die faces the transparent substrate;
    a plurality of bond wires coupled to the bond pads on the transparent substrate and not coupled to an inactive side of the sensor die;
    an encapsulant disposed about the sensor die; and
    a plurality of interconnect elements coupled to the bond wires and disposed on a backside of the encapsulant.

2. The electronic device of claim 1, wherein the interconnect elements comprise balls, bumps, studs, pads, or a combination thereof.

3. The electronic device of claim 1, wherein the interconnect elements are located around an outer periphery of the sensor die.

4. The electronic device of claim 1, wherein the interconnect elements are located at least partially above the sensor die.

5. The electronic device of claim 1, wherein the transparent substrate comprises glass.

6. The electronic device of claim 1, wherein the sensor die is not attached to the transparent substrate via a sealant.

7. The electronic device of claim 1, wherein the sensor die comprises an imager sensor.

8. The electronic device of claim 1, wherein the sensor die comprises an imager sensor.

9. The electronic device of claim 1, wherein the electronic device comprises an imager package.

10. An electronic device comprising:
    a transparent substrate having bond pads;
    a sensor die coupled to the bond pads, wherein an active side of the sensor die faces the transparent substrate;
    a plurality of conductive elements disposed on an inactive side of the sensor die;
    a plurality of bond wires coupled to the bond pads on the transparent substrate and to the conductive elements on the inactive side of the sensor die;
    an encapsulant disposed about the sensor die; and
    a plurality of interconnect elements coupled to the conductive elements and disposed on a backside of the encapsulant.

11. The electronic device of claim 10, comprising an insulating substrate disposed on the inactive side of the sensor die.

12. The electronic device of claim 10, wherein the conductive elements comprise balls, bumps, studs, pads, or a combination thereof.

13. The electronic device of claim 10, wherein the interconnect elements comprise balls, bumps, studs, pads, or a combination thereof.

14. An electronic device comprising:
    a transparent substrate;
    a sensor die electrically coupled to the transparent substrate, wherein an active side of the sensor die faces the transparent substrate;
    a plurality of electrically conductive paths configured to couple the sensor die to an external package, wherein the electrically conductive paths comprise bond wires; and
    an encapsulant completely encasing the sensor die on the transparent substrate.

15. The electronic device of claim 14, comprising the external package.

16. The electronic device of claim 15, wherein the external package comprises at least one of a printed circuit board, a printed wiring board, a controller, a memory, or an image processor.

17. The electronic device of claim 14, wherein the electrically conductive path comprises:
    a first conductive element coupled to the active side of the sensor die;
    a bond pad disposed on the transparent substrate and coupled to the first conductive element, wherein the bond wire is coupled to the bond pad; and an interconnect element coupled to the bond wire and disposed on a backside of the encapsulant, wherein the interconnect element comprises a solder ball.

18. The electronic device of claim 14, wherein the electrically conductive path comprises:
 a first conductive element coupled to the active side of the sensor die;
 a bond pad disposed on the transparent substrate and coupled to the first conductive element, wherein the bond wire is coupled to the bond pad; and
 an interconnect element coupled to the bond wire and disposed on a backside of the encapsulant, wherein the interconnect element comprises a land pad.

19. The electronic device of claim 14, wherein the electrically conductive path comprises:
 a first conductive element coupled to the active side of the sensor die;
 a bond pad disposed on the transparent substrate and coupled to the first conductive element, wherein the bond wire is coupled to the bond pad; and
 an interconnect element coupled to the bond wire and disposed on a backside of the encapsulant, wherein the interconnect element comprises a conductive grid and solder balls coupled to the conductive grid.

20. The electronic device of claim 14, wherein the electrically conductive path comprises:
 a first conductive element coupled to the active side of the sensor die;
 a bond pad disposed on the transparent substrate and coupled to the first conductive element, wherein the bond wire is coupled to the bond pad;
 a conductive grid disposed on an inactive side of the sensor die, wherein the bond wire is coupled to the conductive grid;
 a second conductive element coupled to the conductive grid; and
 an interconnect element coupled to the second conductive element.

21. The electronic device of claim 14, wherein the electrically conductive path comprises:
 a first conductive element coupled to the active side of the sensor die;
 a bond pad disposed on the transparent substrate and coupled to the first conductive element, wherein the bond wire is coupled to the bond pad;
 a conductive grid disposed on an insulating substrate disposed on an inactive side of the sensor die, wherein the bond wire is coupled to the conductive grid;
 a second conductive element coupled to the conductive grid; and
 an interconnect element coupled to the second conductive element.

22. The electronic device of claim 14, wherein:
 the electronic device comprises a side-castellated imager package;
 the electrically conductive path comprises a first conductive element coupled to the active side of the sensor die and a bond pad disposed on the transparent substrate and coupled to the first conductive element, wherein the bond wire is coupled to the bond pad; and
 the electrically conductive path terminates on a side of the imager package.

23. An electronic device comprising:
 a transparent substrate having bond pads;
 a sensor die coupled to the bond pads on the transparent substrate, wherein an active side of the sensor die faces the transparent substrate;
 an encapsulant completely encasing the sensor die on the transparent substrate; and
 a plurality of bond wires coupled to the bond pads on the transparent substrate and routed directly to an exterior of the encapsulant.

24. The electronic device of claim 23, comprising a plurality of interconnect elements coupled to the bond wires and disposed on the exterior of the encapsulant.

25. The electronic device of claim 24, wherein the interconnect elements comprise balls, bumps, studs, pads, or a combination thereof.

26. The electronic device of claim 23, wherein the bond wires are routed directly to a backside of the encapsulant.

27. The electronic device of claim 23, wherein the bond wires are routed directly to a side wall of the encapsulant.

* * * * *